US012588338B2

(12) United States Patent
Lin et al.

(10) Patent No.: US 12,588,338 B2
(45) Date of Patent: Mar. 24, 2026

(54) MICRO DISPLAY DEVICE AND METHOD FOR FABRICATING THE SAME

(71) Applicant: UNITED MICROELECTRONICS CORP., Hsin-Chu City (TW)

(72) Inventors: Chuan-Lan Lin, Chiayi City (TW); Yu-Ping Wang, Hsinchu City (TW); Chien-Ting Lin, Tainan City (TW); Chun-Ting Yeh, Taipei City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 689 days.

(21) Appl. No.: 18/078,103

(22) Filed: Dec. 9, 2022

(65) Prior Publication Data

US 2024/0162401 A1 May 16, 2024

(30) Foreign Application Priority Data

Nov. 10, 2022 (CN) .......................... 202211404124.7

(51) Int. Cl.
H10H 20/857 (2025.01)
H01L 25/075 (2006.01)
H10H 20/01 (2025.01)

(52) U.S. Cl.
CPC ....... H10H 20/857 (2025.01); H01L 25/0753 (2013.01); *H10H 20/0364* (2025.01)

(58) Field of Classification Search
CPC .. H10H 20/857; H10H 20/0364; H10H 20/01; H10H 29/142; H01L 25/0753; H01L 25/167
See application file for complete search history.

(56) References Cited

U.S. PATENT DOCUMENTS

| | | | |
|---|---|---|---|
| 9,728,521 B2 | 8/2017 | Tsai et al. | |
| 11,005,083 B2 | 5/2021 | Du et al. | |
| 2012/0013554 A1* | 1/2012 | Nam | G06F 3/044 |
| | | | 345/173 |
| 2019/0123006 A1* | 4/2019 | Chen | H01L 24/09 |
| 2019/0296204 A1* | 9/2019 | Oh | H10H 20/856 |
| 2019/0393389 A1* | 12/2019 | Chen | H10H 20/8514 |
| 2020/0373456 A1* | 11/2020 | Yan | H10H 20/8312 |
| 2021/0296373 A1* | 9/2021 | Yeon | H10K 59/131 |
| 2023/0132292 A1* | 4/2023 | Yan | H10H 20/01 |
| | | | 438/4 |
| 2023/0187582 A1* | 6/2023 | Noh | H01L 25/167 |
| | | | 257/79 |
| 2023/0215968 A1* | 7/2023 | Yan | H10H 29/10 |
| | | | 257/88 |
| 2023/0367417 A1* | 11/2023 | Yeh | G06F 3/04164 |
| 2024/0055442 A1* | 2/2024 | Ito | H10D 86/60 |

* cited by examiner

*Primary Examiner* — Victor A Mandala
(74) *Attorney, Agent, or Firm* — Winston Hsu

(57) ABSTRACT

A method for fabricating a micro display device includes the steps of providing a wafer comprising a first area, a second area, and a third area, forming first bonding pads on the first area, forming second bonding pads on the second area, and forming third bonding pads on the third area. Preferably, the first bonding pads and the second bonding pads are made of different materials and the first bonding pads and the third bonding pads are made of different materials.

13 Claims, 4 Drawing Sheets

MICRO DISPLAY DEVICE AND METHOD FOR FABRICATING THE SAME

BACKGROUND OF THE INVENTION

1. Field of the Invention

The invention relates to a method for fabricating semi-conductor device, and more particularly, to a method of using 3DIC approach for fabricating micro display device.

2. Description of the Prior Art

As technology advances, augmented reality (AR) and virtual reality (VR) applications also progresses rapidly and in a foreseen future, AR and VR applications will likely be applicable to our daily lives including various applications in the fields of education, logistics, medicine, and military. Currently, AR and VR applications are commonly implemented by head-mounted displays. The head-mounted displays in most circumstances connect the display driver integrated circuits (DDICs) including high-voltage (HV) devices, medium-voltage (MV) devices, and/or low-voltage (LV) devices to a display module through extremely long wires or metal interconnections. This design is typically applied to larger scale products that not only consumes a great amount of space but also increases the difficulty for mounting the device. Hence, how to improve the current process for producing a display device suitable for both AR and VR environments have become an important task in this field.

SUMMARY OF THE INVENTION

According to an embodiment of the present invention, a method for fabricating a micro display device includes the steps of providing a wafer comprising a first area, a second area, and a third area, forming first bonding pads on the first area, forming second bonding pads on the second area, and forming third bonding pads on the third area. Preferably, the first bonding pads and the second bonding pads are made of different materials and the first bonding pads and the third bonding pads are made of different materials.

According to another aspect of the present invention, a micro display device includes a wafer having a first area, a second area, and a third area, first bonding pads on the first area, and second bonding pads on the second area. Preferably, the first bonding pads and the second bonding pads are made of different materials.

These and other objectives of the present invention will no doubt become obvious to those of ordinary skill in the art after reading the following detailed description of the pre-ferred embodiment that is illustrated in the various figures and drawings.

DETAILED DESCRIPTION

Figure 1:
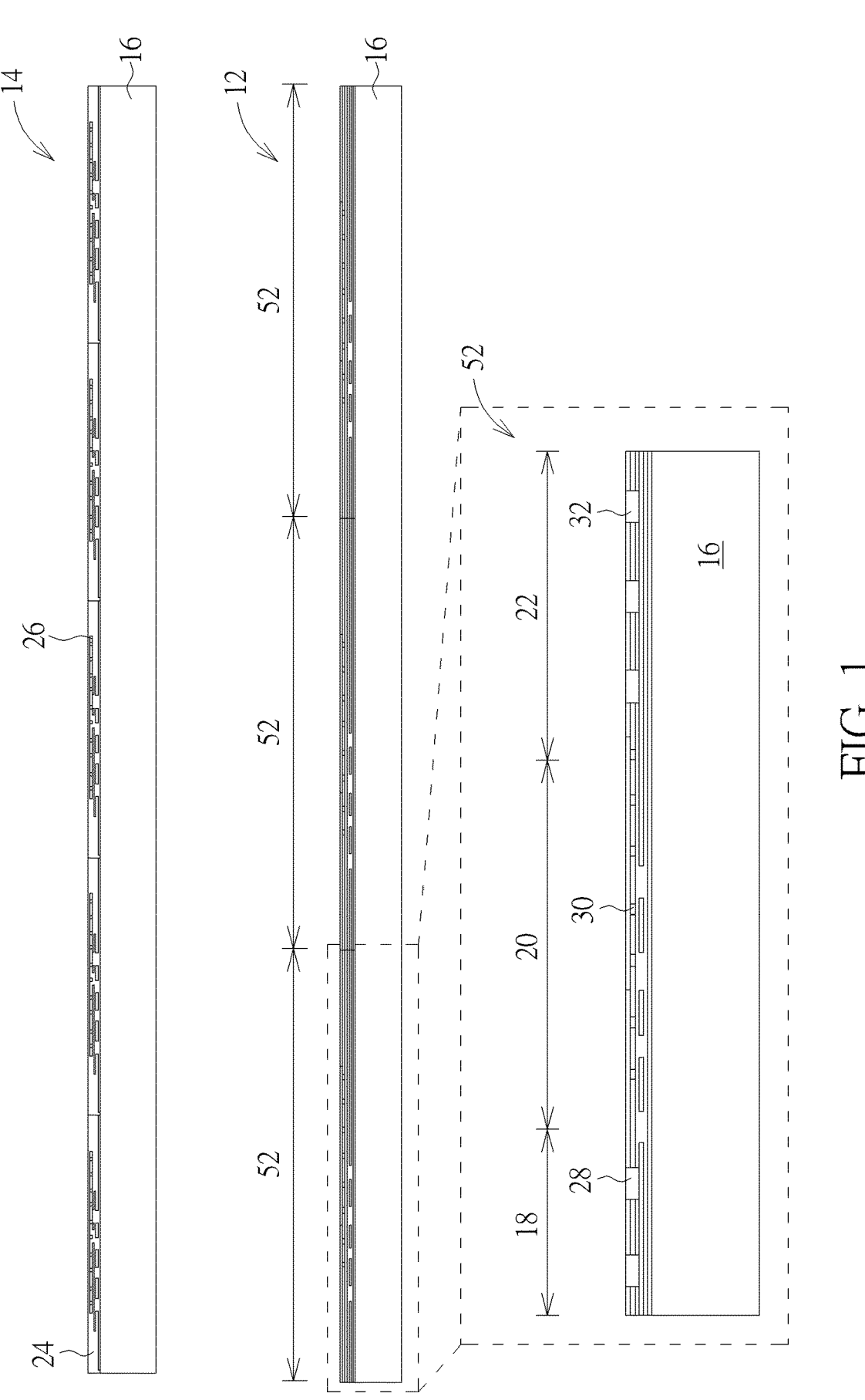
FIGS. 1-5 illustrate a method for fabricating a micro display device according to an embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodi-ment," "some embodiments," etc., indicate that the embodi-ment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodi-ment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the mean-ing of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accord-ingly.

As used herein, the term "substrate" refers to a material onto which subsequent material layers are added. The sub-strate itself can be patterned. Materials added on top of the substrate can be patterned or can remain unpatterned. Fur-thermore, the substrate can include a wide array of semi-conductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Referring to FIGS. 1-5, FIGS. 1-5 illustrate a method for fabricating a micro display device according to an embodiment of the present invention. As shown in FIG. 1, a wafer 12 and a wafer 14 both made of semiconductor material is provided, in which the wafer 12 includes MV devices, HV devices, and pixel circuits thereon while the wafer 14 includes LV devices for LV driving circuits and/or graphics process unit (GPU) thereon. Preferably, each of the wafers 12, 14 include a substrate 16 made of semiconductor materials as the substrate 12 could also be made of semiconductor substrate material including but not limited to for example silicon substrate, epitaxial silicon substrate, silicon carbide substrate or even a silicon-on-insulator (SOI) substrate, which are all within the scope of the present invention.

It should be noted that since the wafer 12 is typically used for supporting or connecting part of the LV devices and display modules after the wafer 14 is diced, hence a plurality of die regions 52 could be first defined on the wafer 12 so that after the other chips are bonded onto the wafer 12, the wafer 12 could then be diced according to each of the die regions 52. Preferably, the area or size of each of the die regions 52 is substantially greater than the size of the chip bonded afterwards and three regions including a first area 18, a second area 20, and a third area 22 are further defined on each of the die regions 52. Preferably, the first area 18 includes a bonding area used for connecting to external circuits, the second area 20 includes a chip to wafer area used for bonding to chips or dies obtained from dicing the wafer 14, and the third area 22 includes a micro-display area used for connecting to a micro display module.

In this embodiment, active devices and/or passive devices could be disposed on the wafers 12, 14, in which the active device could include metal-oxide semiconductor (MOS) transistor, oxide semiconductor field effect transistor (OS FET), fin field effect transistor (FinFET), or other active devices. If a MOS transistor were to be fabricated, the MOS transistor could include elements such as a gate structure on the substrate 16, a spacer (not shown) adjacent to the sidewalls of the gate structure, and a source/drain region in the substrate adjacent to two sides of the spacer, an interlayer dielectric (ILD) layer or inter-metal dielectric (IMD) layer 24 disposed on each of the MOS transistors, and metal interconnections 26 disposed in the ILD layer or IMD layer for connecting to each of the MOS transistors. Preferably, the devices or elements disposed on the wafer 12 are fabricated through a 65-80 nm technology node while the devices or elements disposed on the wafer 14 are fabricated through a 28-40 nm technology node.

At this stage or before other diced chips are bonded onto the wafer 12, a plurality of bonding pads 28, 30, 32 are disposed on each of the first area 18, the second area 20, and the third area 22 of the wafer 12 for connecting to the aforementioned active or passive devices. For achieving optimal connection with other devices in the later process, the bonding pads 28, 30, 32 disposed on the first area 18, the second area 20, and the third area 22 and the target elements connected to the bonding pads 28, 30, 32 afterwards could be made of same material or different materials while the bonding pads 28, 30, 32 themselves on the first area 18, the second area 20, and the third area 22 could also be made of same material or different materials.

For instance, the bonding pads 28 disposed on the first area 18 and the bonding pads 30 disposed on the second area 20 could be made of same material or different materials, the bonding pads 28 disposed on the first area 18 and the bonding pads 32 disposed on the third area 22 could be made of same material or different materials, and the bonding pads 30 disposed on the second area 20 and the bonding pads 32 disposed on the third area 22 could be made of same material or different materials. In this embodiment, since the bonding pads 28 disposed on the first area 18 are preferably used for connecting to external circuits, the bonding pads 28 are preferably made of low resistance material including but not limited to for example gold (Au). Moreover, the bonding pads 30 disposed on the second area 20 are preferably made of copper (Cu) and the bonding pads 32 disposed on the third area 22 preferably used for connecting to solder balls or bumps from a micro display module are preferably made of Cu or Al. It should be noted that in contrast to a plurality of bonding pads 28, 30, 32 have already been disposed on the first area 18, the second area 20, and the third area 22 of the wafer 12, no bonding pads are disposed on the wafer 14 at this stage except the aforementioned active devices and metal interconnections 26 connecting to the active devices.

In addition, the bonding pads 28, 30, 32 disposed on the first area 18, the second area 20, and the third area 22 also have different pitches, gaps, or spacing therebetween. For instance, the pitch or spacing between the bonding pads 28 on the first area 18 is preferably greater than the pitch or spacing between the bonding pads 30 on the second area 20 and the pitch or spacing between the bonding pads 28 on the first area 18 is also greater than the pitch or spacing between the bonding pads 32 on the third area 22. The pitch or spacing between the bonding pads 30 on the second area 20 on the other hand could be equal to or slightly less than the pitch or spacing between the bonding pads 32 on the third region 22. In this embodiment, the pitch or spacing between the bonding pads 28 on the first area 18 is preferably between 20-200 microns (μm), the pitch or spacing between the bonding pads 30 on the second area 20 is between 1-20 microns, and the pitch or spacing between the bonding pads 32 on the third area 22 is between 2-20 microns.

It should further be noted that the pitch or spacing between the bonding pads 28, 30, 32 on each area preferably refers to that all of the pitches or spacing between the bonding pads 28, 30, 32 on a certain area being less than or greater than the pitches or spacing between the bonding pads 28, 30, 32 on another area. For instance, the statement of the pitch or spacing between bonding pads 28 on the first area 18 being greater than the pitch or spacing between bonding pads 30 on the second area 20 and the pitch or spacing between bonding pads 32 on the third area 22 typically refers to that all of the pitches or spacing between bonding pads 28 on the first area 18 are greater than all of the pitches or spacing between bonding pads 30 on the second area 20 and all of the pitches or spacing between bonding pads 32 on the third area 22.

Figures 2, 3:
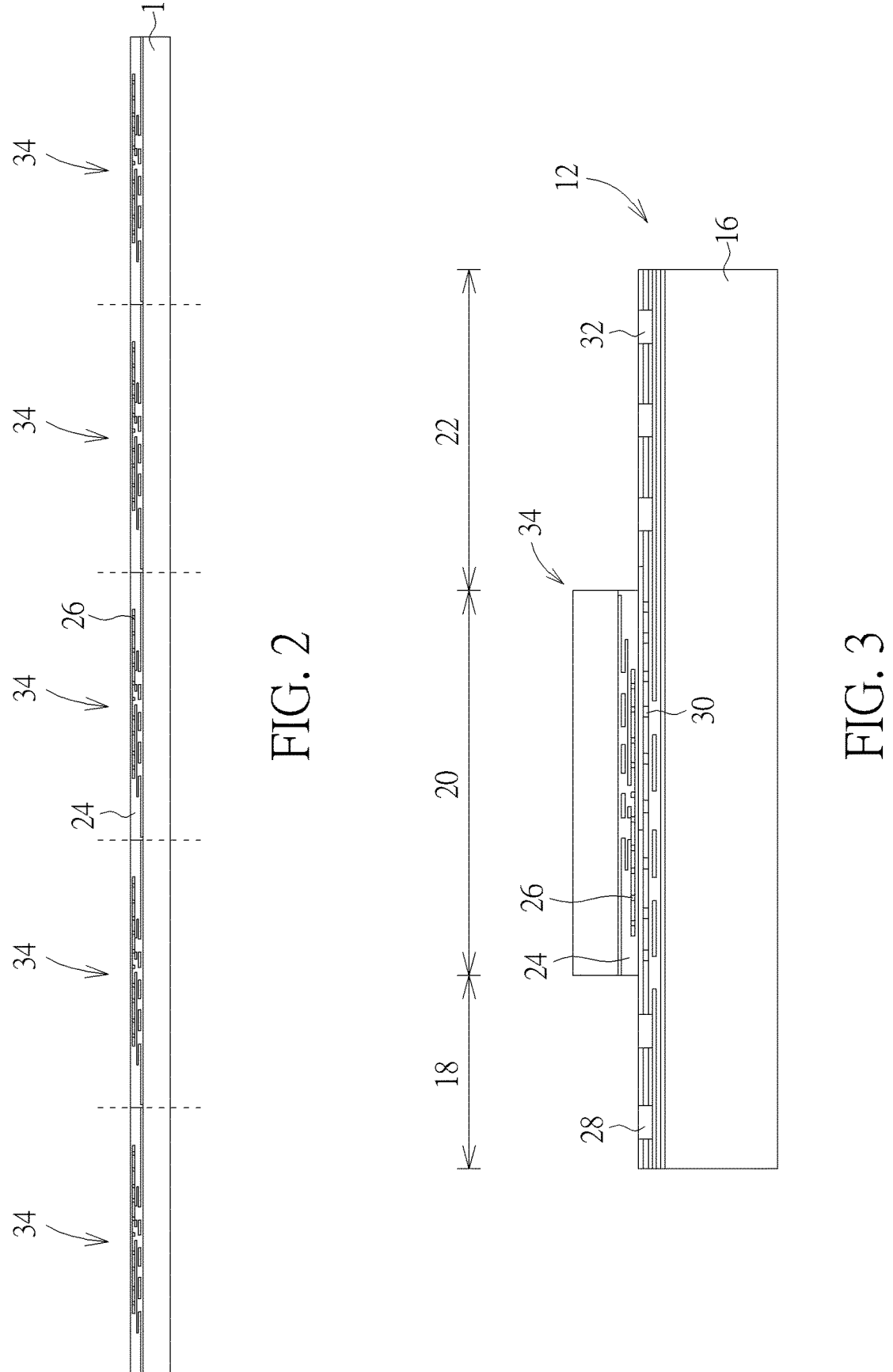

Next, as shown in FIG. 2, a thinning process is conducted to remove part of the substrate 16 of the wafer 14 thereby lowering the overall thickness of the wafer 14, and then a dicing process is conducted to dice the wafer 14 into a plurality of dies or chips 34.

Next, as shown in FIG. 3, the diced chip 34 is then reversed and then a bonding process is conducted to bond the chip 34 carrying elements such as LV driving circuits and/or GPUs onto the un-diced wafer 12 carrying MV devices and HV devices. In this embodiment, the metal interconnections 26 on the chip 34 are preferably bonded to the bonding pads 30 on the second area 20 of the wafer 12 through a hybrid bonding approach, in which the metal interconnections 26 on the chip 34 are made of Cu while the bonding pads 30 on the second area 20 are also made of Cu. As such, the two elements 26 and 30 are directly connected or bonded with each other having front side facing front side through a hybrid bonding process.

Figure 4:
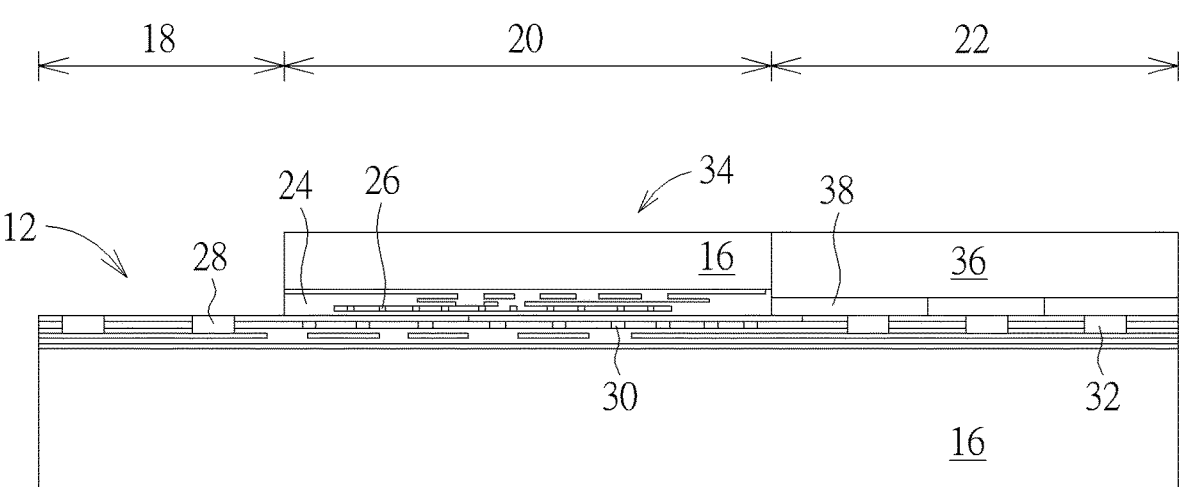

Next, as shown in FIG. 4, a display module fabrication process is conducted to form a micro display 36 connected to the bonding pads 32 on the third area 22. In this embodiment, the micro display 36 could include various display device including but not limited to for example an organic light emitting diode (OLED) display, a mini light emitting diode display, or a micro light emitting diode display depending on the demand of the process or product and each of the micro displays 36 could further include color pixels 38 such as red, green, and blue.

Figure 5:
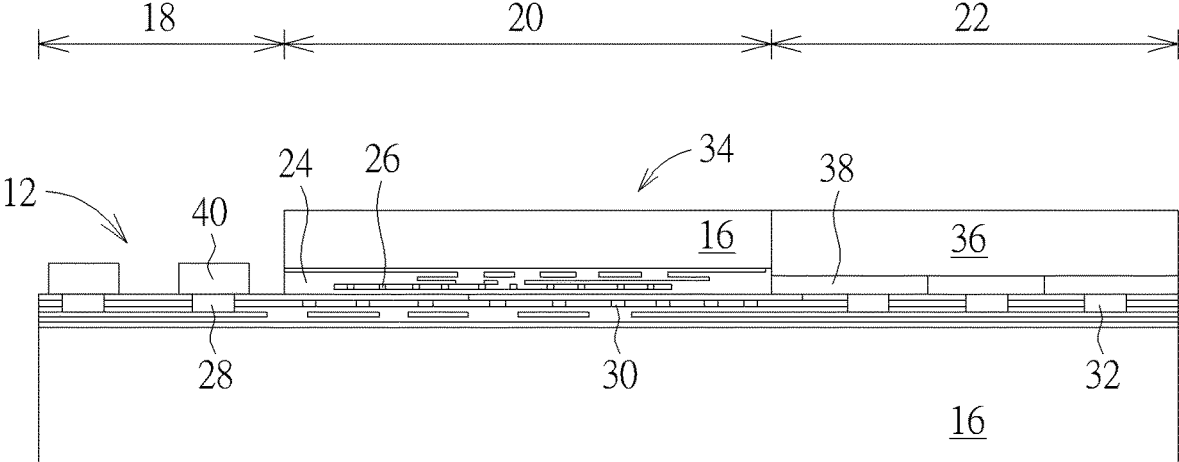

Next, as shown in FIG. 5, conductive wires such as wires 40 are formed to connect to the bonding pads 28 on the first area 18 of the wafer 12, and then the wafer 12 could be diced along the die regions 52 defined in the beginning into desirable dies or chips for later packaging process depending on the demand of the process. In this embodiment, the wires 40 used to connect to external circuits are preferably made of Cu while the bonding pads 28 on the first area 18 are preferably made of low resistance material such as Au. This completes the fabrication of a micro display device according to an embodiment of the present invention.

Figure 6:
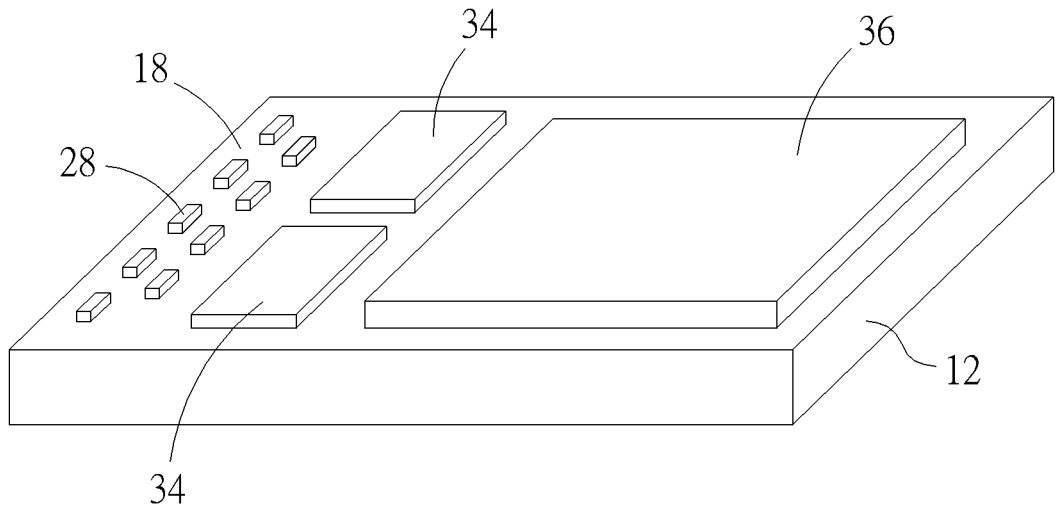
FIG. 6 illustrates a 3-dimensional view of a micro display device according to an embodiment of the present invention.
Figure 7:
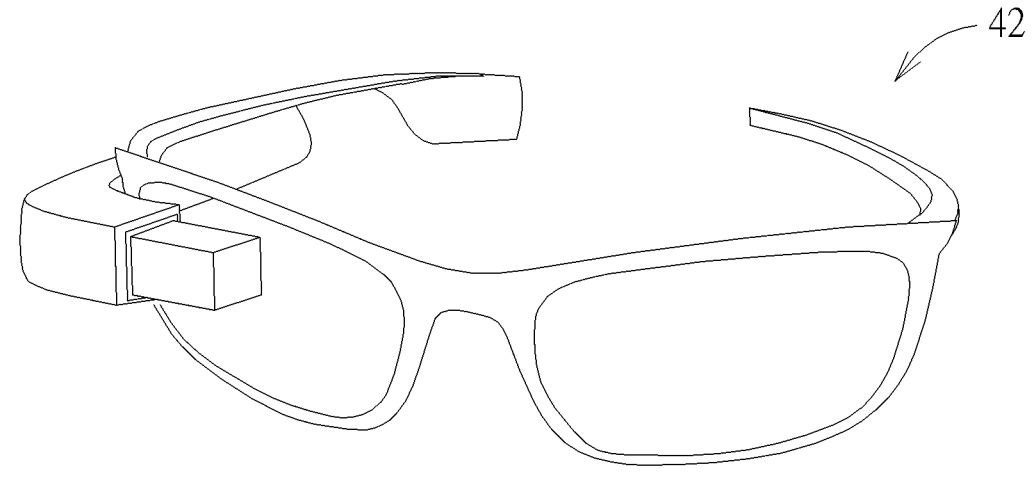
FIG. 7 illustrates a schematic view of applying micro display device to a AR/VR wearable device such as a AR/VR headset or glasses according to an embodiment of the present invention.

Referring to FIGS. 6-7, FIG. 6 illustrates a 3-dimensional view of a micro display device according to an embodiment of the present invention and FIG. 7 illustrates a schematic view of applying micro display device to a AR/VR wearable device such as a AR/VR headset or glasses according to an embodiment of the present invention. As shown in FIG. 6, the micro display device fabricated through the processes shown in FIGS. 1-5 preferably includes a wafer 12 carrying MV and HV devices or dies obtained from dicing the wafer 12, chips 34 carrying LV devices of driving circuits or GPUs on the wafer 12, a micro display 36 disposed on the wafer 12, and first area 18 defined on the wafer 12 for connecting to external circuits, in which the first area 18 includes aforementioned bonding pads 28 for physically connecting to the external circuits. According to an embodiment of the present invention, all of the assemblies from the structure shown in FIG. 6 could be integrated to a AR/VR wearable device 42 or headset as shown in FIG. 7 depending on the demand of the product.

Overall, the present invention discloses an approach of using 3DIC stack and packaging approach for fabricating a micro display device. Preferably, it would be desirable to first provide a silicon substrate such as a wafer 12 carrying elements such as MV devices, HV devices, and pixel circuits, in which the wafer 12 could be serving as a carrier substrate for supporting LV devices and micro display modules. Next, a plurality of areas are defined on the wafer including a first area 18 used for connecting to external circuits, a second area 20 used for carrying LV device chips, and a third area 22 used for connecting to a micro display module. Next, external circuits, diced chips carrying LV devices, and micro display module are then bonded to the bonding pads disposed on the three areas 18, 20, 22 respectively. In contrast to conventional system on a chip (SoC) approach for fabricating micro displays, the approach of using 3DIC technique for fabricating micro display devices of the present invention not only reduces overall size and volume of the final product substantially, but also lowers overall cost while maintaining performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a micro display device, comprising:
   providing a wafer comprising a first area, a second area, and a third area;
   forming first bonding pads on the first area;
   forming second bonding pads on the second area, wherein the first bonding pads and the second bonding pads comprise different materials;
   forming a chip on the second bonding pads; and
   forming a micro display on the third area after forming the chip.

2. The method of claim 1, further comprising:
   forming third bonding pads on the third area, wherein the first bonding pads and the third bonding pads comprise different materials.

3. The method of claim 2, wherein the second bonding pads and the third bonding pads comprise different materials.

4. The method of claim 2, wherein a pitch between the first bonding pads is greater than a pitch between the third bonding pads.

5. The method of claim 1, wherein a pitch between the first bonding pads is greater than a pitch between the second bonding pads.

6. The method of claim 1, wherein the first area comprises a bonding area.

7. A micro display device, comprising:
   a wafer comprising a first area, a second area, and a third area;
   first bonding pads on the first area;
   second bonding pads on the second area, wherein the first bonding pads and the second bonding pads comprise different materials; and
   third bonding pads on the third area, wherein the first bonding pads and the third bonding pads comprise different materials.

8. The micro display device of claim 7, wherein the second bonding pads and the third bonding pads comprise different materials.

9. The micro display device of claim 7, wherein a pitch between the first bonding pads is greater than a pitch between the third bonding pads.

10. The micro display device of claim 7, wherein a pitch between the first bonding pads is greater than a pitch between the second bonding pads.

11. The micro display device of claim 7, wherein the first area comprises a bonding area.

12. The micro display device of claim 7, wherein the second area comprises a chip to wafer area.

13. The micro display device of claim 7, wherein the third area comprises a micro-display area.

\* \* \* \* \*